(12) United States Patent
Chang et al.

(10) Patent No.: US 7,495,921 B2
(45) Date of Patent: Feb. 24, 2009

(54) FAN BRACKET AND HEAT DISSIPATION APPARATUS INCORPORATING THE SAME

(75) Inventors: Yuh-Ching Chang, Taipei Hsien (TW);
Yong-Qiang Zhao, Shenzhen (CN);
Ming-Kun Cao, Shenzhen (CN)

(73) Assignees: Fu Zhun Precision Industry (Shen Zhen) Co., Ltd., Shanzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/695,456

(22) Filed: Apr. 2, 2007

(65) Prior Publication Data

US 2008/0174967 A1     Jul. 24, 2008

(30) Foreign Application Priority Data

Jan. 24, 2007   (CN) .................. 2007 1 0073107

(51) Int. Cl.
*H05K 7/20* (2006.01)
*H01L 23/36* (2006.01)

(52) U.S. Cl. ............... 361/719; 361/695; 361/697; 361/704; 165/80.3; 165/121

(58) Field of Classification Search .......... 361/687, 361/688, 690–697, 712–714, 715–721; 165/80.3, 165/80.4, 80.5, 104.33, 121, 185; 257/706–727; 29/832, 836, 837, 838, 890.03, 890.035, 29/890.04; D13/179
See application file for complete search history.

(56) References Cited

U.S. PATENT DOCUMENTS

| | | | | |
|---|---|---|---|---|
| 5,495,392 A | * | 2/1996 | Shen .................. | 361/697 |
| 5,615,998 A | * | 4/1997 | Kodama et al. ........... | 415/177 |
| 5,943,209 A | * | 8/1999 | Liu ................... | 361/695 |
| 6,401,807 B1 | * | 6/2002 | Wyler et al. ............ | 165/121 |
| 6,419,007 B1 | * | 7/2002 | Ogawara et al. .......... | 165/80.3 |
| 6,621,699 B2 | * | 9/2003 | Watanabe et al. ......... | 361/697 |
| D501,450 S | * | 2/2005 | Watanabe et al. ......... | D13/179 |
| 6,860,323 B2 | * | 3/2005 | Cheng .................. | 165/121 |
| 6,924,983 B2 | * | 8/2005 | Otsuki et al. ........... | 361/704 |
| 6,927,979 B2 | * | 8/2005 | Watanabe et al. ......... | 361/697 |

(Continued)

FOREIGN PATENT DOCUMENTS

JP    02002134972 A   *   5/2002

(Continued)

*Primary Examiner*—Michael V Datskovskiy
(74) *Attorney, Agent, or Firm*—Frank R. Niranjan

(57) ABSTRACT

A heat dissipation apparatus (100) includes a fan bracket (20), a fan (10) and a heat sink (40). The fan bracket includes a housing (22), a support portion (242) extending from the housing, and a plurality of arm portions (244) extending from the housing in a direction opposite to the support portion. Each of the arm portions includes an engaging portion (244a) extending outwardly therefrom, engaging with a fastener (30) to mount the heat dissipation apparatus to a printed circuit board (50). At least two arm portions each include a hook (244c) extending inwardly therefrom. The fan is attached to the support portion of the fan bracket. The heat sink is held between the arm portions of the fan bracket with a bottom surface of the heat sink engaging with the hooks.

15 Claims, 4 Drawing Sheets

U.S. PATENT DOCUMENTS

| | | | |
|---|---|---|---|
| 6,934,155 B2 | 8/2005 | Aoki et al. | |
| D509,485 S * | 9/2005 | Mochizuki et al. | D13/179 |
| 7,120,746 B2 * | 10/2006 | Campbell et al. | 711/130 |
| 7,123,483 B2 * | 10/2006 | Otsuki et al. | 361/710 |
| 7,221,567 B2 * | 5/2007 | Otsuki et al. | 361/695 |
| 7,278,209 B2 * | 10/2007 | Otsuki et al. | 29/890.047 |
| D561,120 S * | 2/2008 | Chen et al. | D13/179 |
| D561,121 S * | 2/2008 | Mochizuki et al. | D13/179 |
| D561,122 S * | 2/2008 | Mochizuki et al. | D13/179 |
| D561,123 S * | 2/2008 | Mochizuki et al. | D13/179 |
| 7,331,256 B2 * | 2/2008 | Allard et al. | 74/512 |
| D564,460 S * | 3/2008 | Otsuki et al. | D13/179 |
| 2008/0030952 A1* | 2/2008 | Chen et al. | 361/697 |

FOREIGN PATENT DOCUMENTS

JP    02004063686 A  *  2/2004

* cited by examiner

FAN BRACKET AND HEAT DISSIPATION APPARATUS INCORPORATING THE SAME

BACKGROUND OF THE INVENTION

1. Field of the Invention

The present invention relates to fan brackets, and more particularly to a fan bracket which can mount a heat dissipating apparatus onto a heat producing component without requiring the addition of a complicated structure on the heat dissipating apparatus.

2. Description of Related Art

Heat dissipation apparatus are traditionally used in microelectronics to help transfer of heat from heat producing components. The heat dissipation apparatus includes a heat sink absorbing heat from the heat producing component, and a heat dissipating fan generating an airflow which flows through the heat sink to take away heat therefrom.

In the heat dissipation apparatus, a fan bracket is used to attach the heat dissipating fan onto the heat sink. A conventional fan bracket includes a housing, four arm portions extending downwardly from the housing, and a fixing portion extending upwardly from the housing. The heat dissipating fan is fixed to the fan bracket via the fixing portion. The heat sink is attached to the fan bracket via the arm portions. Each of the arm portions includes a hook extending inwardly from a free end thereof. The heat sink defines four concaves for receiving the hooks therein so as to attach the heat sink onto the fan bracket. Thus, there is a need for carving the concaves in the heat sink during manufacturing of the heat sink. This complicates the manufacture of the heat sink and increases the cost thereof. In addition, there is a need for providing additional fasteners to attach the heat sink to the heat producing component. Also, engaging structures need to be arranged on the heat sink to engage with the fasteners, which further complicates the manufacture of the heat sink and increases the cost thereof. Therefore, there is a need to provide a fan bracket which can mount a heat sink onto the heat producing component without requiring the addition of a complicated structure on the heat sink.

SUMMARY OF THE INVENTION

The present invention relates, in one respect, to a fan bracket. The fan bracket includes a housing, a support portion extending from the housing, and a plurality of arm portions extending from the housing in a direction opposite to the support portion. At least two arm portions each include a hook extending inwardly therefrom. A circular hole is defined in the fan bracket for accommodating therein a fan and a heat sink below the fan.

The present invention relates, in another respect, to a heat dissipation apparatus. The heat dissipation apparatus includes a fan bracket, a fan and a heat sink. The fan bracket includes a housing, a support portion extending from the housing, and a plurality of arm portions extending from the housing in a direction opposite to the support portion. Each of the arm portions includes an engaging portion extending outwardly therefrom. The fan is attached to the support portion of the fan bracket. The heat sink is held between the arm portions of the fan bracket. Fasteners are used to extend through engaging portions at bottoms of the arm portions and a printed circuit board to mount the heat dissipation device to a heat source on the printed circuit board.

Other advantages and novel features of the present invention will become more apparent from the following detailed description of preferred embodiments when taken in conjunction with the accompanying drawings, in which:

DETAILED DESCRIPTION OF THE INVENTION

Figure 1:
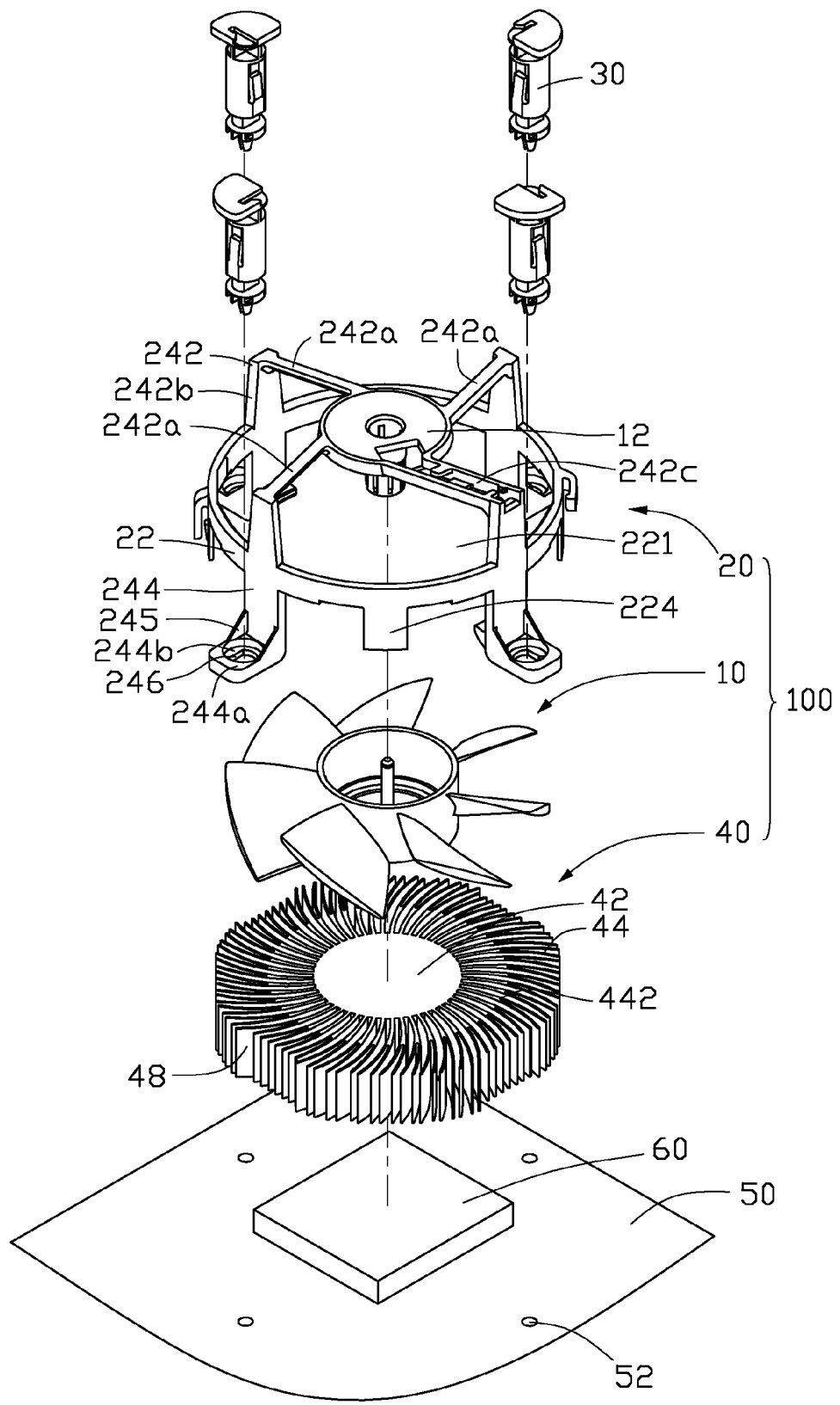
FIG. 1 is an exploded, isometric view of a heat dissipation apparatus in accordance with a first embodiment of the present invention.

Referring to FIG. 1, a heat dissipation apparatus 100 according to a preferred embodiment of the present invention is shown. The heat dissipation apparatus 100 is mounted to a printed circuit board 50 with a heat source 60 such as a CPU arranged thereon via four fasteners 30. The heat dissipation apparatus 100 includes a fan bracket 20, a heat dissipating fan 10 and a heat sink 40. The heat dissipating fan 10 and the heat sink 40 are respectively mounted to top and bottom portions of the fan bracket 20. The heat sink 40 contacts with the heat source 60 for absorbing heat therefrom. The heat dissipating fan 10 generates an airflow flowing through the heat sink 40 to take away heat therefrom.

The fan bracket 20 includes a substantially circular housing 22, four arm portions 244 and four positioning portions 224 extending downwardly from the housing 22, and a support portion 242 extending upwardly from the housing 22. The housing 22 defines a circular hole 221 in a middle portion of the fan bracket 20, functioning as a passage for the airflow.

Figure 2:
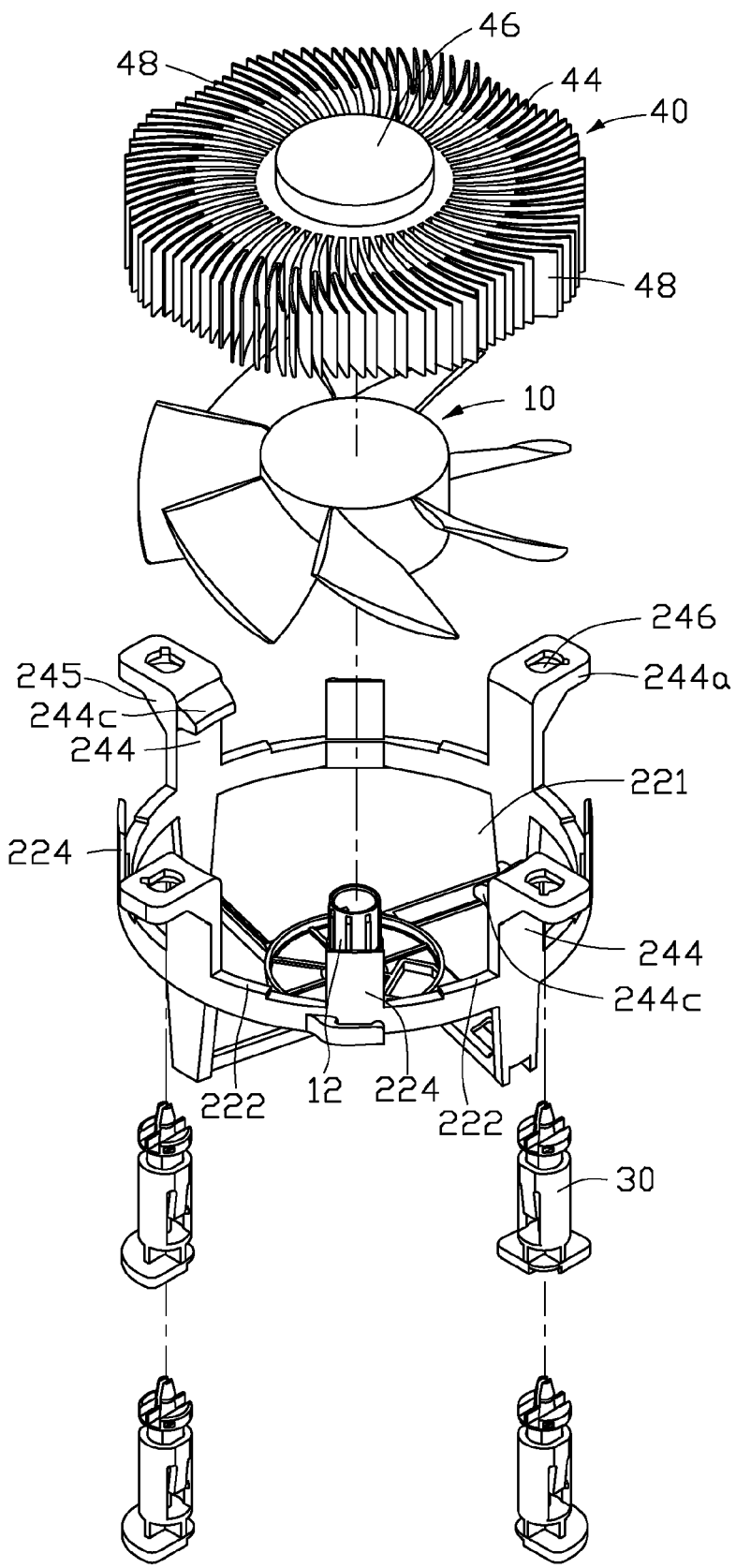
FIG. 2 is similar to FIG. 1, but viewed from another aspect.

Referring to FIG. 2, the arm portions 244 and the positioning portions 224 are alternately and evenly distributed along a periphery of the housing 22. An engaging portion 244a extends outwardly from a bottom of each of the arm portions 244, whilst two hooks 244c extend inwardly from two opposite arm portions 244 of the fan bracket 20. Two ribs 245 are formed at two sides of a joint of the engaging portion 244a and the arm portion 244 for strengthening that joint. The engaging portion 244a defines an indent 244b therein. A non-circular through hole 246 is defined in a bottom of the indent 244b for extending the fastener 30 therethrough.

The support portion 242 includes four support pillar portions 242b equally distributed around the circular hole 221, four extending portions 242a respectively extending from upper ends of the support pillar portions 242b toward a central axis of the fan bracket 20, and a disk portion 12 fixed to inner ends of the four extending portions 242a. An upper end of the heat dissipating fan 10 is fixed to the disk portion 12 with a bottom end thereof being arranged above a top surface of the housing 22. One of the extending portions 242a is provided with a guide groove 242c upward over the entire length of the extending portion 242a. This guide groove 242c is used for leading out electric wires (not shown) of the heat dissipating fan 10 to connect with an external power source electrically.

The heat sink 40 is substantially column shaped in profile and is made of materials having high thermal conductivity such as aluminum, aluminum alloy, copper, or copper alloy. The heat sink 40 includes a column-like base portion 42 and a plurality of fins 44 radially extending outwardly from a periphery of the base portion 42. The fins 44 and the base portion 42 are integrally formed from a single piece. Alternatively, the base portion 42 may be a copper or copper alloy column which is press fitted to the fins 44 made of aluminum, aluminum alloy, copper or copper alloy. The base portion 42 of the heat sink 40 has a lower end surface 46 being placed on the heat source 60. The lower end surface 46 of the base portion 42 extends below bottom surfaces of the fins 44. A gap is formed between the bottom surfaces of the fins 44 and a top surface of the printed circuit board 50. The fins 44 are distributed equally in a periphery of the base portion 42. Each of the fins 44 has a curved profile curving in a direction contrary to a flow direction of the airflow. Alternatively, the curving direction of each of the fins may be the same as the flow direction of the airflow. Two branches 442 are formed at a free end of each fin 42, increasing heat dissipation area of the heat sink 40. Lengths of four equidistantly spaced parts of the fins 44 are shorter than lengths of other parts of the fins 44. Accordingly, four recesses 48 are axially defined in a periphery of the four equidistantly spaced parts of the fins 44 the heat sink 40 for receiving the arm portions 244 of the fan bracket 20 therein. Outer ends of the other parts of the fins 44 are located on an imaginary circle (not shown). A diameter of the imaginary circle is a bit greater than a diameter of the housing 22 of the fan bracket 20. A bottom portion of the housing 22 of the fan bracket 20 has a plurality of lower surfaces 222 which abut against top surfaces of the other parts of the fins 44 so as to sandwich the heat sink 40 between the housing 22 and the heat source 60 of the printed circuit board 50.

The fasteners 30 are push pins which extend through the through holes 246 and engage with the indents 244b of the fan bracket 20 and the printed circuit board 50 so as to mount the fan bracket 20 onto the printed circuit board 50. The non-circle shaped through holes 246 of the fan bracket 20 prevent the fasteners 30 undergoing circumferential rotation with respect to the fan bracket 20. Alternatively, the fasteners 30 may be other components which can mount the fan bracket 20 onto the printed circuit board 50 such as screws, or rivets, and the engaging portions 244a of the fan bracket 20 need to have corresponding structures to match these components.

Figure 3:
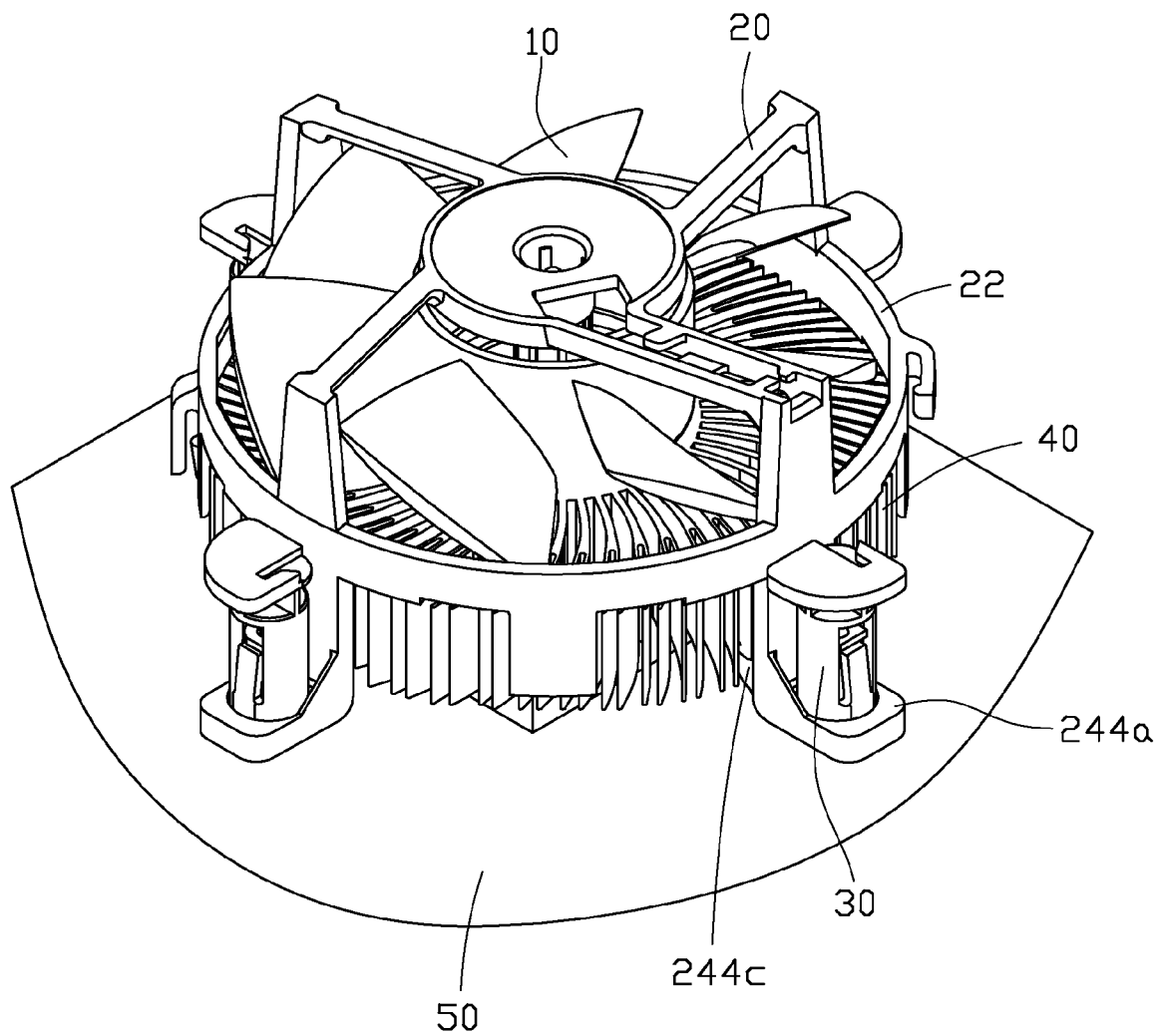
FIG. 3 is an assembled view of the heat dissipation apparatus of FIG. 1.
Figure 4:
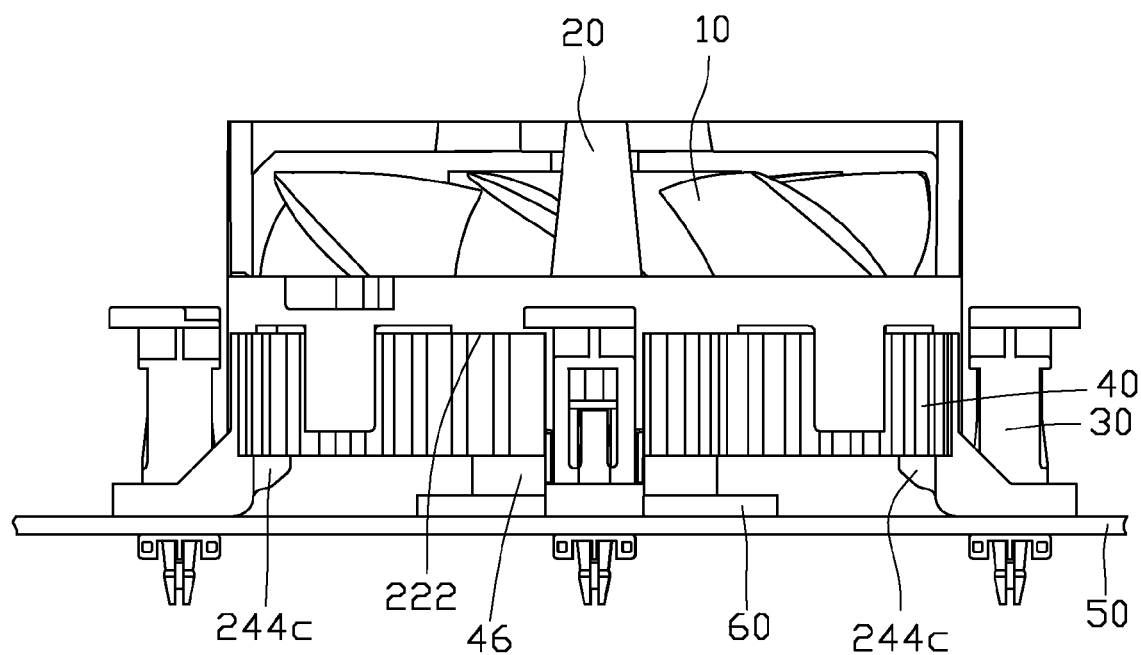
FIG. 4 is a side view of the heat dissipation apparatus of FIG. 3.

Referring to FIGS. 3 and 4, in assembly of the heat dissipation apparatus 100, the heat dissipating fan 10 is mounted to the fan bracket 20. The heat sink 40 is disposed in the fan bracket 20 with the arm portions 244 of the fan bracket 20 being received in the recesses 48 of the heat sink 40 and the hooks 244c of the arm portions 244 engaged with the bottom surfaces of the corresponding fins 44. Meanwhile, the positioning portions 224 of the fan bracket 20 abut against the outer ends of a portion of the fins 44 thereby preventing the heat sink 40 from undergoing horizontal movement. Thus, the heat dissipating fan 10, the fan bracket 20 and the heat sink 40 are assembled together to form the heat dissipation apparatus 100. The heat dissipation apparatus 100 is disposed on the printed circuit board 50 with through holes 246 of the arm portions 244 of the fan bracket 20 aligning with through holes 52 defined in the printed circuit board 50. The fasteners 30 extend through the through holes 246, 52 of the arm portions 244 of the fan bracket 20 and the printed circuit board 50, mounting the heat dissipation apparatus 100 onto the printed circuit board 50. The lower end surface 46 of the base portion 42 widens the gap formed between the bottom surfaces of the fins 44 and the top surface of the printed circuit board 50 thus preventing the hooks 244c of the arm portions 244 of the fan bracket 20 from interfering with the printed circuit board 50.

In the present heat dissipation apparatus 100, the hooks 244c of the fan bracket 20 engage with the bottom surfaces of the fins 44 of the heat sink 40 thereby to attach the heat sink 40 to the fan bracket 20. There is no need to carve concaves in the heat sink 40 which simplifies the structure of the heat sink 40 and decreases the cost thereof. Moreover, the heat dissipation apparatus 100 is mounted onto the printed circuit board 50 via engagement between the arm portions 244 of the fan bracket 20, the printed circuit board 50, and the fasteners 30. Thus, there is no need to design engaging structures, which engage with the fasteners 30, in the heat sink 40. This further simplifies the structure of the heat sink 40 and decreases the cost thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan bracket comprising:
   a housing;
   a support portion extending from the housing; and
   a plurality of arm portions extending from the housing in a direction opposite to the support portion, at least two arm portions each comprising a hook extending inwardly therefrom, wherein a circular hole is defined in the bracket, a portion of the circular hole above the housing is for accommodating a fan therein, and another portion of the circular hole below the housing is for accommodating a heat sink therein;
   wherein an engaging portion extends outwardly from each of the arm portions, and two parallel ribs are formed at two opposite lateral sides of a joint of each arm portion and the engaging portion, each rib being triangle-shaped and interconnecting one lateral side of the each arm portion and a top surface of the engaging portion for strengthening the joint.

2. The fan bracket as described in claim 1, wherein the engaging portion defines an indent therein, a non-circular hole being defined in a bottom of the indent.

3. The fan bracket as described in claim 1, wherein the housing further comprising at least a positioning portion disposed between two adjacent ones of the arm portions.

4. The fan bracket as described in claim 1, wherein the support portion comprises a plurality of support pillar portions, a plurality of extending portions respectively extending from upper ends of the support pillar portions toward a central axis of the fan bracket, and a disk portion fixed to inner ends of the extending portions, the disk portion being configured for fixing the fan thereon.

5. A heat dissipation apparatus comprising:
   a fan bracket comprising a housing, a support portion extending from the housing, and a plurality of arm portions extending from the housing in a direction opposite to the support portion, each of the arm portions comprising an engaging portion extending outwardly from a bottom end thereof for securing the fan bracket to a printed circuit board;
   a fan received in the fan bracket and attached to the support portion of the fan bracket; and
   a heat sink received in the fan bracket and held between the arm portions of the fan bracket;
   wherein a plurality of recesses are defined in a periphery of the heat sink and extend through the periphery along an axial direction of the heat sink, each recess receiving one of the plurality of arm portions of the housing therein.

6. The heat dissipation apparatus as described in claim 5, wherein at least two of the arm portions each comprise a hook extending inwardly therefrom and opposite to the engaging portion, the hook engaging a bottom of the heat sink.

7. The heat dissipation apparatus as described in claim 5, wherein the engaging portion defines an indent therein, a non-circular hole being defined in a bottom of the indent.

8. The heat dissipation apparatus as described in claim 5, wherein two ribs are formed at two opposite lateral sides of a joint of the each of the arm portions and the engaging portion, each rib interconnecting one lateral side of the each of the arm portions and the engaging portion for strengthening the joint.

9. The heat dissipation apparatus as described in claim 5, wherein the heat sink comprises a base portion and a plurality of fins extending radically outwardly from the base portion, and the housing further comprises at least a positioning portion disposed between two adjacent ones of the arm portions and abutting against outer ends of some of the fins.

10. The heat dissipation apparatus as described in claim 5, wherein the heat sink comprises a base portion and a plurality of curved fins disposed around the base portion.

11. The heat dissipation apparatus as described in claim 10, wherein a bottom surface of the base portion of the heat sink extends below bottom surfaces of the fins.

12. The heat dissipation apparatus as described in claim 10, wherein a curved direction of the fins is contrary to a flow direction of an airflow generated by the fan.

13. The heat dissipation apparatus as described in claim 5, wherein a bottom surface of the fan is arranged above a top surface of the housing.

14. The heat dissipation apparatus as described in claim 5, wherein the heat sink comprises a base portion and a plurality of fins extending radically outwardly from the base portion, and the housing of the fan bracket has a plurality of lower surfaces abutting against top surfaces of some of the fins.

15. A heat dissipation apparatus comprising:
a printed circuit board having a heat generating electronic component thereon;
a fan bracket secured to the printed circuit board and surrounding the electronic component;
a heat sink mounted in a lower portion of the fan bracket and thermally connecting with the electronic component, wherein a plurality of recesses are defined in a periphery of the heat sink and extend through the periphery along an axial direction of the heat sink; and
a fan mounted in an upper portion of the fan bracket for generating an airflow through the heat sink;
wherein the fan bracket has a middle ring-shaped housing, a plurality of arm portions extending downwardly from the housing and fitted in the recesses of the heat sink, at least two of the arm portions each forming a hook engaging a bottom of the heat sink, each of the arm portions forming an outwardly extending engaging portion at a bottom thereof, two parallel ribs being formed at two opposite lateral sides of a joint of each arm portion and the engaging portion, each rib interconnecting one lateral side of the arm portion and a top surface the engaging portion for strengthening the joint, a fastener extending through the engaging portion and the printed circuit board to secure the fan bracket together with the heat sink and the fan on the printed circuit board, a plurality of pillar portions extending upwardly from the housing, a plurality of extending portions extending inwardly from top ends of the pillar portions, respectively, a disk portion being connected to inner ends of the extending portions, the fan being fixed to the disk portion.

* * * * *